United States Patent [19]
Marsh et al.

[11] Patent Number: 5,129,832
[45] Date of Patent: Jul. 14, 1992

[54] SURFACE MOUNT ELECTRICAL CONNECTOR AND METHOD OF MAKING THE SAME

[75] Inventors: Edward K. Marsh, Kernersville; Chrystal B. Yates, Clemmons, both of N.C.

[73] Assignee: AMP Incorporated, Harrisburg, Pa.

[21] Appl. No.: 670,679

[22] Filed: Mar. 18, 1991

Related U.S. Application Data

[63] Continuation-in-part of Ser. No. 558,026, Jul. 25, 1990, abandoned.

[51] Int. Cl.⁵ ............................................ H01R 23/72
[52] U.S. Cl. ...................................... 439/79; 439/83; 29/844
[58] Field of Search .................. 439/79, 76, 78, 80, 439/83, 247, 248, 329, 876, 877, 81, 82; 29/842, 844, 876, 882

[56] References Cited

U.S. PATENT DOCUMENTS

| | | | |
|---|---|---|---|
| 4,050,769 | 9/1977 | Ammon | 439/79 |
| 4,505,035 | 3/1985 | Burton et al. | 439/79 |
| 4,550,962 | 11/1985 | Czeschka | 439/79 |
| 4,583,807 | 4/1986 | Kaufman et al. | 439/79 |
| 4,686,607 | 8/1987 | Johnson | 439/78 |
| 4,721,472 | 1/1988 | Gentry et al. | 439/79 |
| 4,734,042 | 3/1988 | Martens et al. | 439/79 |
| 4,875,863 | 10/1989 | Reed | 439/79 |
| 4,955,819 | 9/1990 | Harting et al. | 439/79 |
| 4,968,266 | 11/1990 | Yamamoto | 439/630 |
| 5,046,952 | 9/1991 | Cohen et al. | 439/79 |

FOREIGN PATENT DOCUMENTS 2095485  9/1982  United Kingdom ............ 439/78

Primary Examiner—Larry I. Schwartz
Assistant Examiner—Kevin J. Carroll

[57] ABSTRACT

An electrical connector is disclosed for mounting to a printed circuit board where the electrical connector includes electrical terminals having surface mount contacts adapted for electrical engagement against conductive pads on a printed circuit board. The electrical connector also includes front mating contact portions with lead sections intermediate the contact portions and the surface mount contact portions. An alignment tine plate is positioned over the intermediate lead portions above the surface mount contacts to correctly position the surface mount contacts in an array which corresponds to the conductive pads on the printed circuit board. The alignment plate includes elongate ribs extending from a lower surface of the plate an upper surface of the surface mount contacts, thereby spanning the entire row of contacts. To form the surface mount contacts, the alignment plate is inserted over the plurality of intermediate lead portions, and a comb-like die member is inserted above the tine plate and held in place. A further die member is movable towards the intermediate lead portions transversely thereof and bends the intermediate lead portions about the respective rib members, using the rib members as mandrels for the bending process.

15 Claims, 7 Drawing Sheets

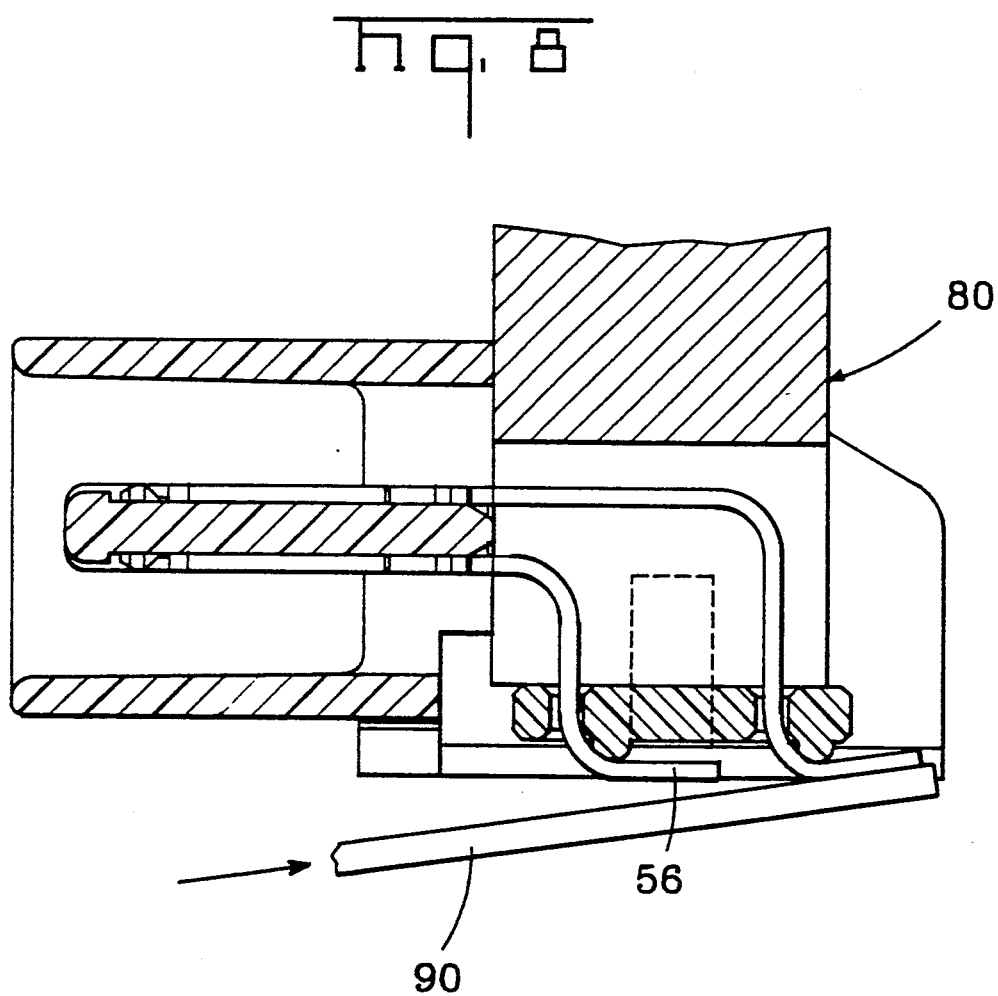

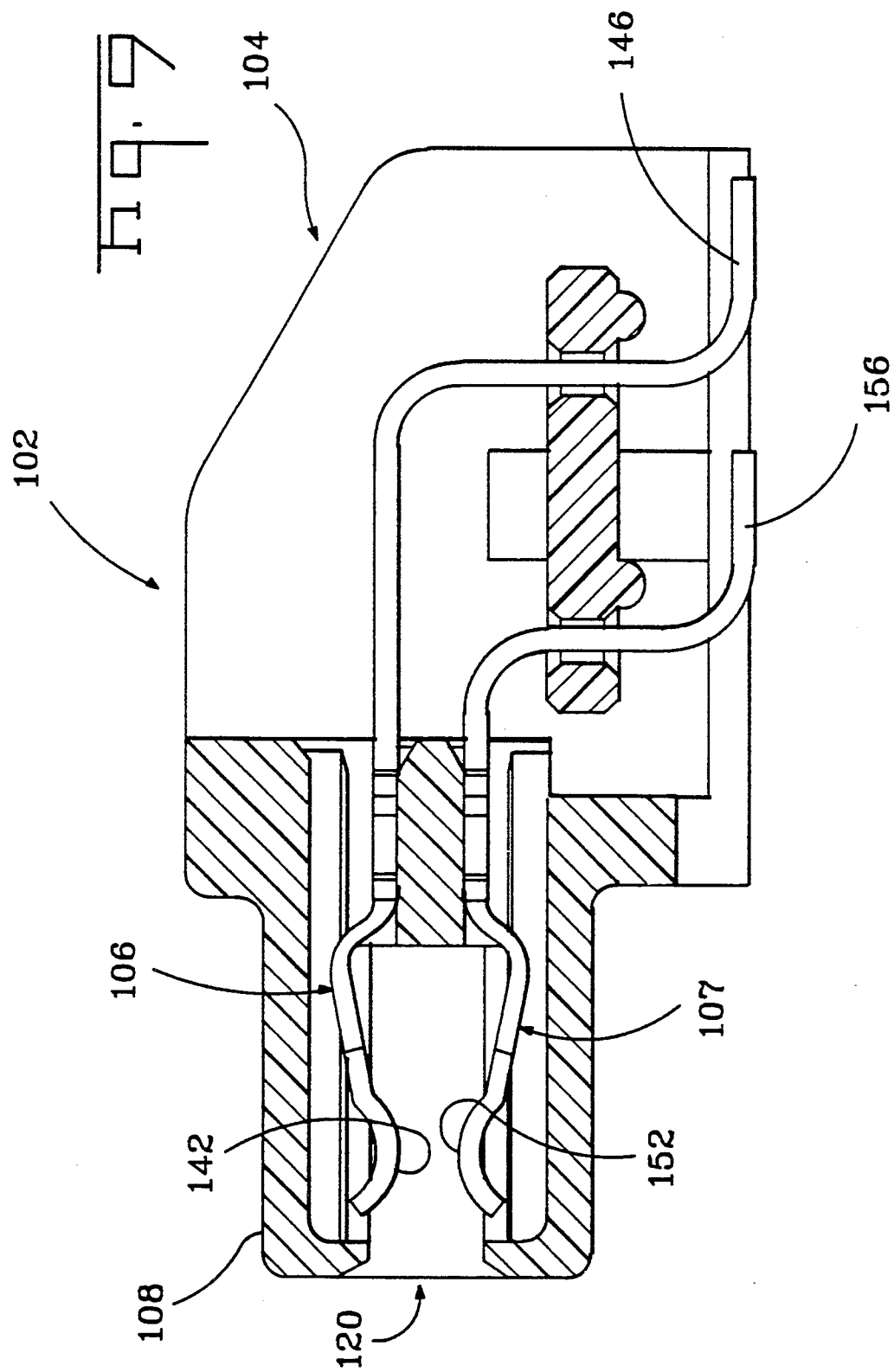

SURFACE MOUNT ELECTRICAL CONNECTOR AND METHOD OF MAKING THE SAME

BACKGROUND OF THE INVENTION

This is a continuation-in-part of pending U.S. Patent Application Ser. No. 07/558,026, filed Jul. 25, 1990, now abandoned.

FIELD OF THE INVENTION

The subject invention relates to a printed circuit board mounted connector having surface mount contacts, and in particular to an electrical connector having a slidable tine plate for position assurance of the surface mount contacts, where the tine plate can also be used for the formation of the surface mount contacts.

DESCRIPTION OF THE PRIOR ART

It is well known in the art to electrically interconnect electrical connectors to printed circuit boards for supplying power to the printed circuit board, and for data transmission of electrical signals to and from the printed circuit board. It is typical that these electrical connectors are in the form of right angle headers having mating contacts facing away from the printed circuit board, and printed circuit board contacts electrically interconnected to printed circuit traces on a printed circuit board.

The printed circuit board contacts generally take on two forms of interconnection, either a through hole interconnection or a surface mount interconnection. In a through hole interconnection, the connector includes electrical leads extending vertically from the housing positioned in an array to extend through the printed circuit board through holes. The through holes of the printed circuit board are typically plated through holes interconnected to electrical traces on the board, and the connector lead sections are soldered in place to electrically interconnect the terminal lead sections to the circuit traces on the printed circuit board.

Alternatively, the electrical connector can include surface mount contacts which extend from the lead sections and are formed either as a flat contact section or as a radius contact section. In either event, the plurality of surface mount contacts are positioned to lie in a planar array for electrical interconnection to an upper surface of a printed circuit board. The printed circuit board will include conductive pads thereon in an array to match the surface mount contacts, and are profiled for solderability of the surface mount contact portions thereto.

In either case, one of the difficulties in interconnecting the electrical connector to the printed circuit board is aligning the plurality of electrical terminals with either the through hole contacts or the surface mount pads on a printed circuit board. In the case of the through hole type electrical contacts, it is common to include a slidable plate which is moveable in a vertical direction along the length of the terminals to retain the electrical terminals in the predetermined array.

Reference is made to McHugh U.S. Pat. No. 4,469,387 where a slidable locating member is positioned between two rows of vertical contacts and can be moved downwardly towards the free ends of the lead sections. When the receptacle connector is positioned against the circuit board and the lead sections extend into the printed circuit board through holes, continued movement of the receptacle towards the printed circuit board moves the plate upwardly into the connector.

The slidable positioning plate has not heretofore been used with surface mount contacts however, as the plates are not insertable over the lead sections of the terminals after the formation of the surface mount contacts. Surface mount contacts are presently held in place by forming the electrical terminals from thick metal stock and using the rigidity in the electrical terminals to retain the formed position. However, as the density of electrical connections increases, the electrical terminals must be made from thinner metal stock where the lead ends are very fragile, thus requiring some type of positioning or alignment means.

An object of the invention then is to provide an electrical connector for surface mount application against a printed circuit board, where the connector includes a positioning plate for arranging and retaining the electrical lead sections of the electrical terminals in a predesignated array.

It is a further object of the invention to provide for a method of making the electrical terminals of the electrical connector, for the electrical connector includes such a positioning plate.

Other objects and advantages of the invention will be apparent from the following description, the accompanying drawings and the appended claims.

SUMMARY OF THE INVENTION

The objects of the invention were accomplished by designing a surface mount electrical connector comprising an insulative housing having a front mating face with a plurality of terminal receiving passageways therein. The housing further comprises a mounting face adapated for abutment against a substrate. A plurality of electrical terminals are positioned in the terminal receiving passageways where the terminals comprise contact portions positioned proximate to the mating face, surface mount contact portions positioned adjacent to the mounting face, and lead portions interconnecting the contact portions and the surface mount contact portions. A tine plate has apertures therethrough for receiving the terminal lead sections and the tine plate is slidable along the lead sections. The tine plate further includes projection means extending from the tine plate facing the surface mount contact portions.

By including a tine plate having projection means, the tine plate can be used for the formation of the surface mount contact portions. The tine plate is held in a fixed positioned and is used as a mandrel whereby the ends of the lead sections can be bent over the tine plate.

A novel method of forming surface mount contacts on an electrical connector of the type mentioned above comprises the steps of placing terminals within an electrical housing with lead portions of the terminals proximate to a mounting face of the housing. A plate means having aperture means is slid over the lead sections, with the lead sections aligned with and extending through the aperture means. The plate means is used as a mandrel and the ends of the lead sections are bent under the plate means thereby forming the surface mount contact portions.

BRIEF DESCRIPTION OF THE DRAWINGS

FIG. 3 is a bottom plan view of the subject connector;

FIGS. 5–8 are cross-sectional views showing progressively the formation of the surface mount portions of the terminals;

FIG. 9 is a cross-sectional view, similar to that of FIGS. 5–8, showing an alternate receptacle connector.

DETAILED DESCRIPTION OF THE PREFERRED EMBODIMENT

Figure 1:
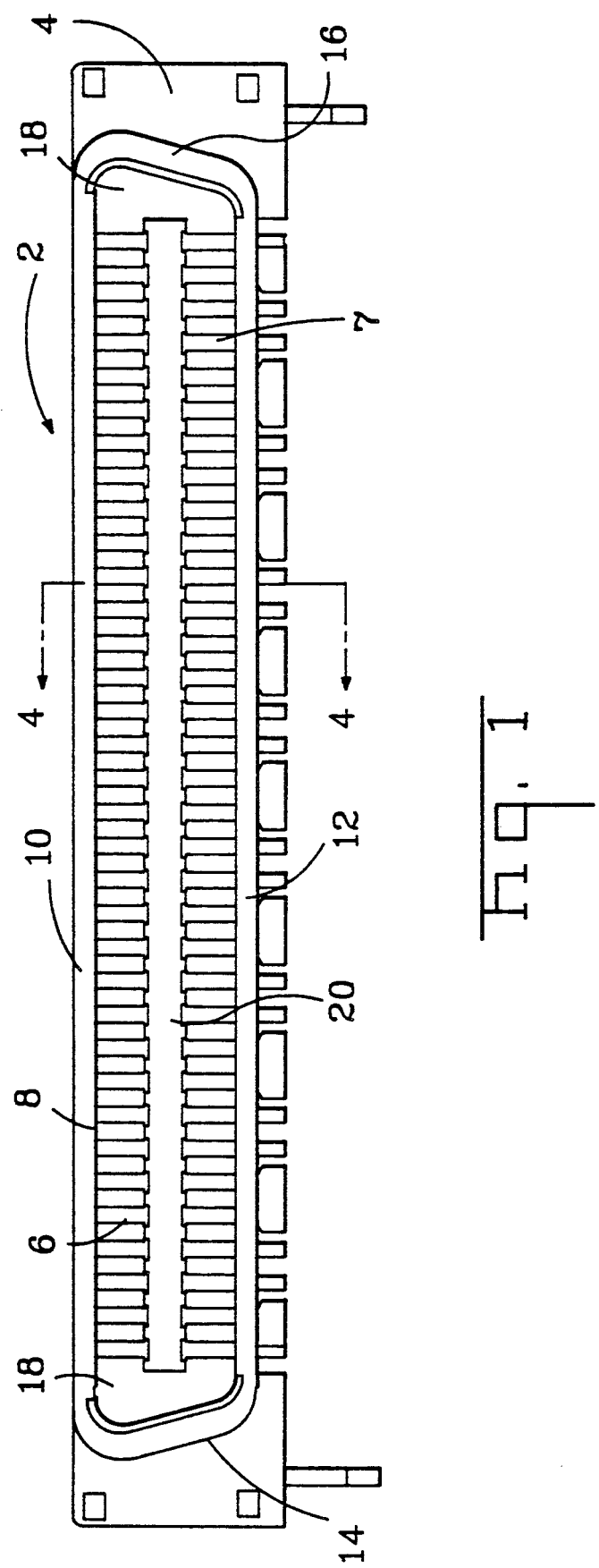
FIG. 1 is a front plan view of the subject connector.
Figure 2:
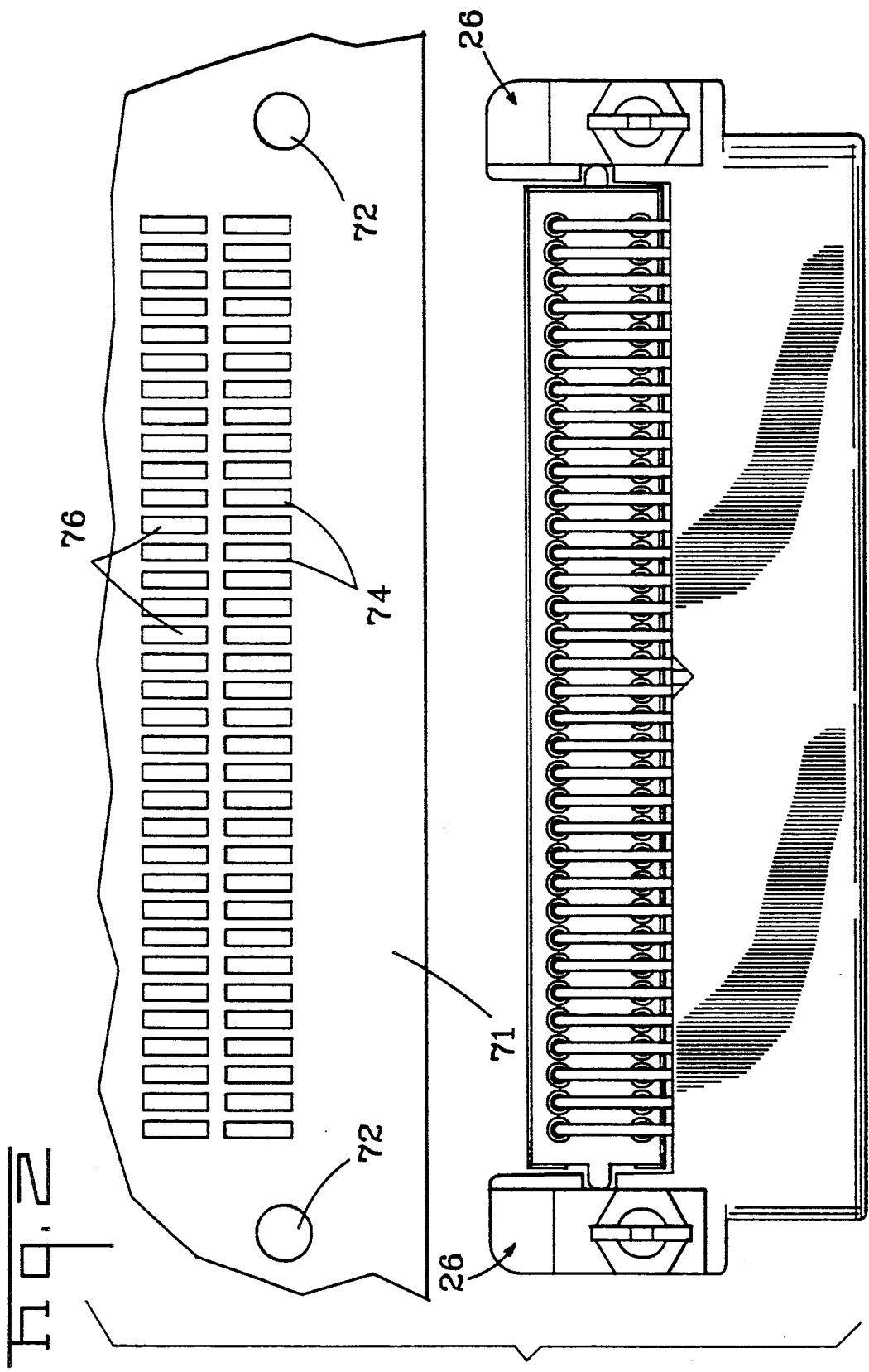
FIG. 2 is a top plan view of the subject connector positioned proximate to a matable printed circuit board.
Figure 4:
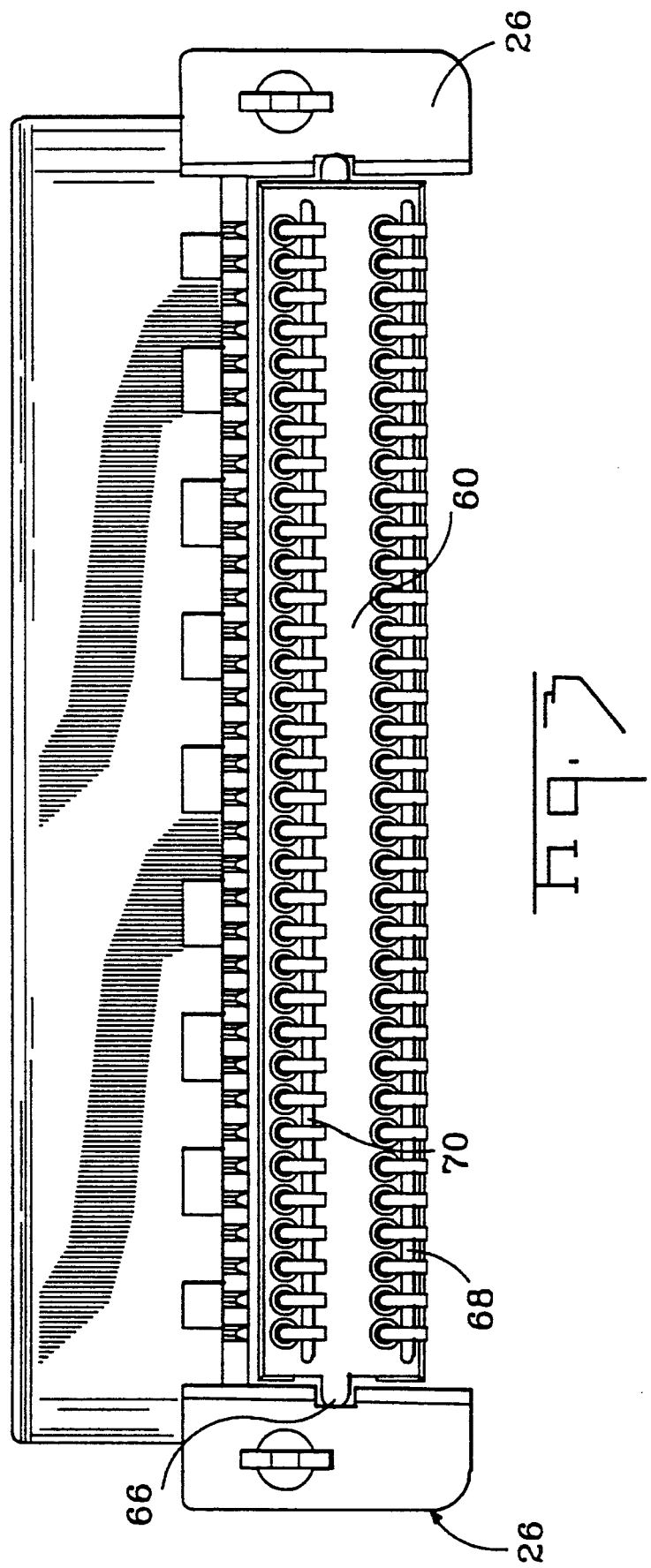
FIG. 4 is a cross-sectional view through lines 4—4 of FIG. 1.
Figure 4:
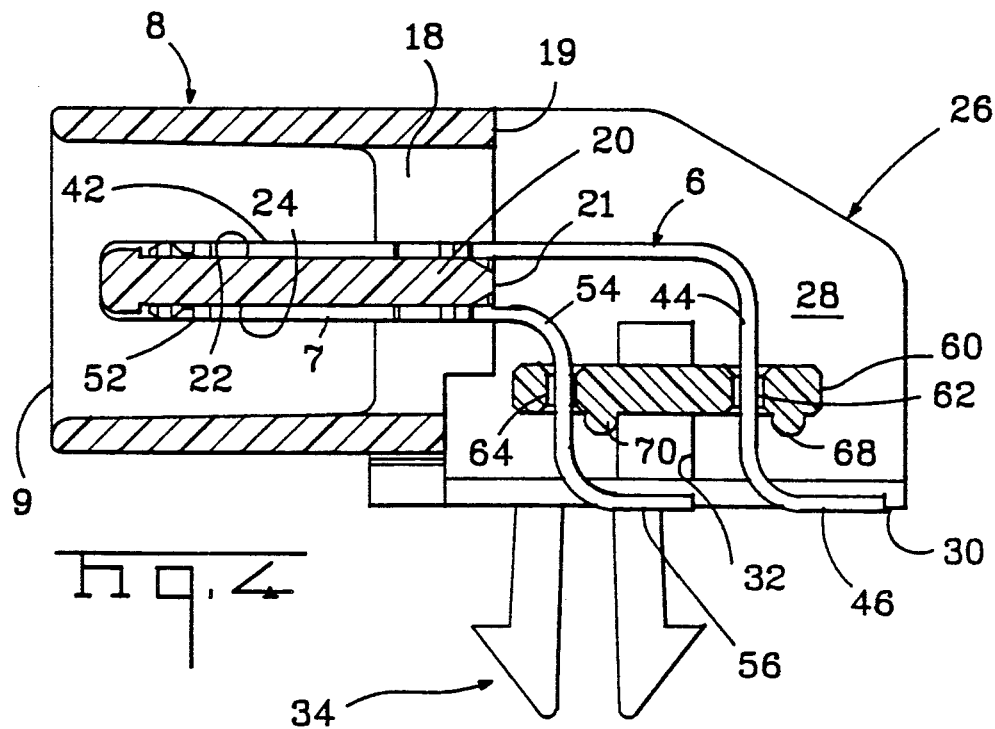

With reference first to FIG. 1, an electrical receptacle 2 is shown as including an insulating housing 4 having a plurality of terminals or contacts 6, 7. The receptacle 2 is of the type having an insulating shroud 8 surrounding the terminals, the shroud forming a D-shaped mating enclosure. The shroud 8 includes an upper wall 10, a lower wall 12 and sidewalls 14 and 16. As shown in FIG. 1, an intermediate wall 18 is integrally connected between the sidewalls 14, and between the upper and lower wall 10 and 12 and integrally retains a terminal receiving platform 20 to the connector housing. As shown in FIG. 4, the terminal receiving platform 20 includes upper terminal receiving channels or passageways 22 on an upper surface of the platform 20, and lower terminal receiving passageways 24 on a lower surface of the platform 20. As shown in FIGS. 2, 3, and 4, the housing 4 further comprises mounting feet 26 at opposite ends of the housing 4 having an inner surface 28 (FIG. 4) and a lower mounting surface 30. Channels 32 are formed on the inner surface 28 of both mounting feet 26. As shown in FIG. 4, the connector also includes a conventional printed circuit board retaining feature such as the split arrow device 34, as shown in FIG. 4.

As shown in FIG. 4, the connector further comprises an upper row of contacts 6 including a contact portion 42 positioned in the terminal passageway 22 adjacent to the front mating face 9 of housing 4. The contacts 6 further comprise an intermediate lead section 44 having at its free end a surface mount contact portion 46. As also shown in FIG. 4, the lower row of contacts 7 comprise spring contact portions 52 located in the lower terminal passageways 24 of the platform 20 and further include intermediate lead sections 54 and surface mount contact portions 56.

With reference still to FIG. 4, the connector 2 further comprises a tine plate 60 having a plurality of apertures 62, 64 extending through the plate with the lead sections 44 and 54 of the terminals 6 and 7 extending therethrough. The tine plate 60 is frictionally engageable against the plurality of terminal lead portions or sections 44 and 54 and slidable vertically upwardly and downwardly into various horizontal positions. As shown in FIG. 3, the tine plate 60 includes at both ends thereof, a guide tab 66 (FIG. 3) which is adapted for receipt in the guide slot or channel 32 of the mounting feet 26 for guiding the tine plate in a vertical path during the movement of the tine plate 60. Finally, the tine plate 60 includes projection means comprising elongate ribs 68 and 70 which will be described in greater detail herein.

Advantageously then, the connector 2 can be interconnected to a printed circuit board such as 71 (FIG. 2) having mounting holes 72 and a plurality of conductive pads, such as a row of pads 74, and a second row of pads 76. It should be understood that the apertures 62 and 64 of the tine plate 60, have center line spacings equal to the center line spacings of the conductive pads 76 and 74, respectively. It should also be understood that the centerline spacing between apertures 62 and 64 of the tine plate 60 is the same as the centerline spacing between the two rows of circuit pads 76 and 74, such that the tine plate positions the surface mount contacts 46 and 56 in registry with the conductive pads 76 and 74.

Figure 5:
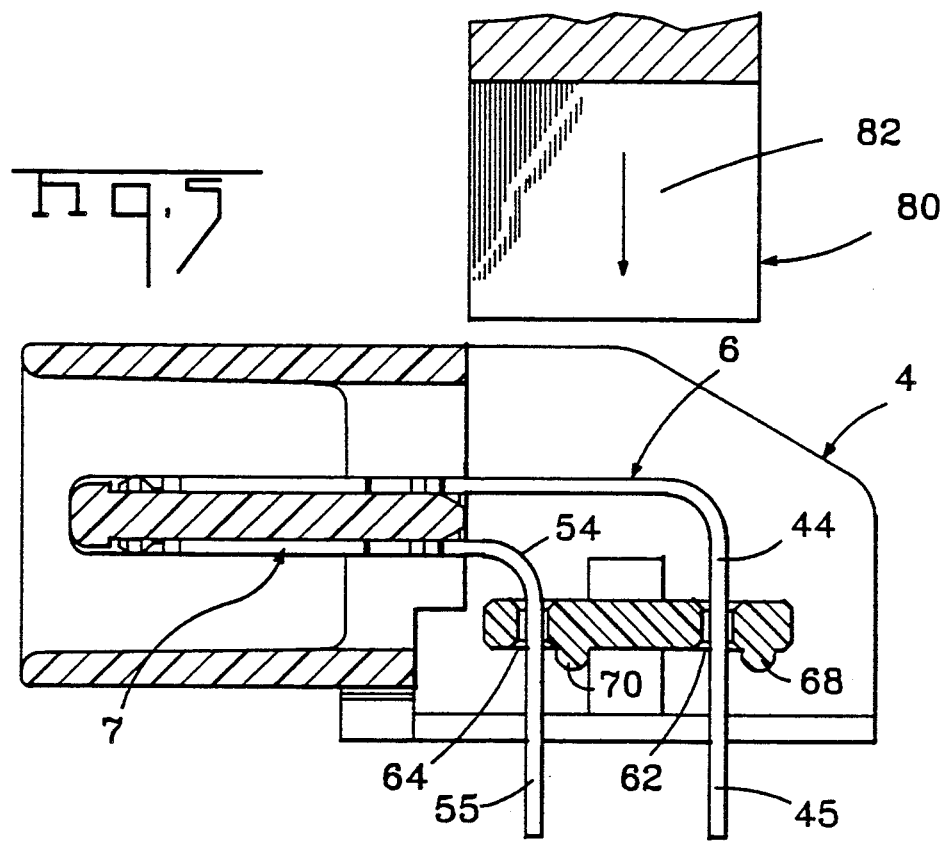

With reference now to FIGS. 5–8, the assembly of the above mentioned connector will be described in greater detail. As shown in FIG. 5, the lower row of terminals 7 are inserted into the lower terminal receiving passageways 24 with the free ends 55 extending vertically downward. The upper row of electrical terminals 6 are next inserted in the upper terminal passageways 22 with the free ends 45 forming a second rearward row and also extending vertically downward. With the two rows of electrical terminals 6 and 7 so positioned, the tine plate 60 can be slidably received over the intermediate lead ends with the apertures 62 over the free ends 45 and the apertures 64 over the free ends 55. The tine plate 60 is moved vertically upwardly to a position where the guide tabs 66 (FIG. 3) at the ends of the tine plate 60 are inserted within the respective guide slots 32.

Figure 6:
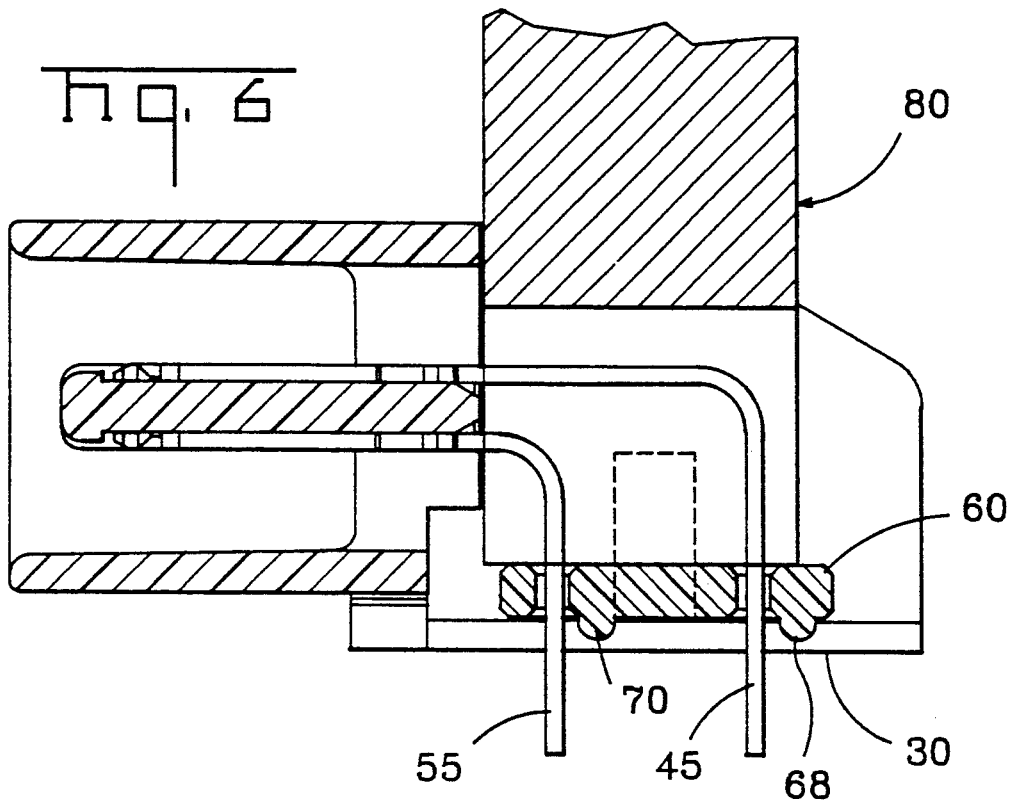

As described above, the area between the two inner surfaces 28 of the mounting feet 26 is accessible from above for access to the terminal rows 6 and 7 and the tine plate 60. With the tine plate 60 inserted over the intermediate sections 44 and 54 as shown in FIG. 5, the connector housing 4 is inserted in a fixture whereby the mounting feet only are held, and a comb-like die 80 having individual teeth 82 is insertable through the open area above the tine plate 60 between the individual aligned intermediate portions 44 and 54, as shown in FIG. 5. The die member 80 is movable from the position shown in FIG. 5 to the position shown in FIG. 6, thereby moving the tine plate 60 to a position where the elongate ribs 68 and 70 are proximate to the lower mounting surface 30 of the housing, as shown in FIG. 6.

Figure 7:
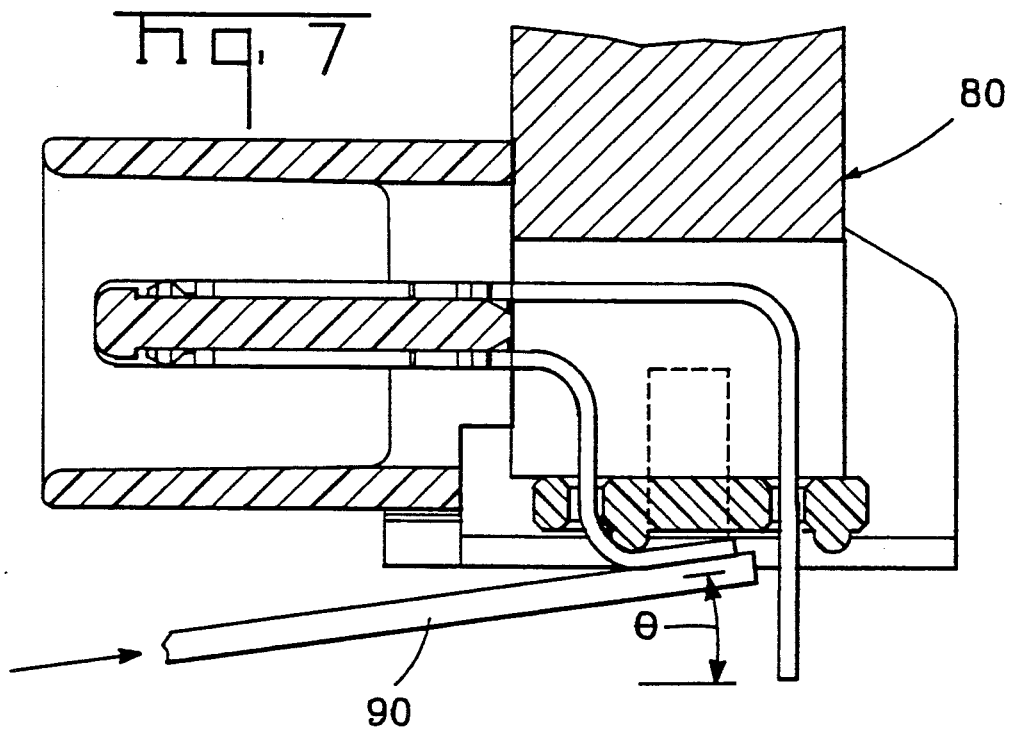

A forming die 90, as shown in FIG. 7, is thereafter moved towards the front row of terminal lead portions 44, in a front-to-back motion, and at an angle θ, to bend the free ends 55 of the lead portions 54 about the elongate rib 70, as shown in FIG. 7. The terminal portions 55 extending downwardly through the tine plate 60 are over bent by an angle θ, to compensate for the spring back associated with such spring metals. Upon retraction of the forming die 90, the surface mount contact portions will spring back approximately to a right angle, as shown in FIG. 8.

The die member 90 is thereafter aligned with the second row of lead portions 45, either by indexing the die member 90 rearwardly, or by indexing the connector forwardly. The forming die 90 is now moved towards the second row of lead portions 45, and bent about rib 68 at an angle θ, as shown in FIG. 8, and upon retraction of the die member 90, the lead portions spring back to an approximate right angle. It should be appreciated that the ribs 68, 70 define a recessed area, into which the terminals 6, 7 can be bent, as shown in FIGS. 7 and 8.

In a preferred embodiment of the invention the surface mount contact portions 46 and 56 are formed such that their respective lower surfaces are slightly below the lower surface 30 of the housing. In a preferred embodiment of the invention, the surface mount contact portions 46 and 56 are formed such that they extend below the lower surface 30 by 0.010 inches. This assures that there is always a slight preloaded contact force between the surface mount contact portions 46, 56 and the conductive pads 74, 76, prior to soldering.

It should be appreciated that the angle θ at which the lead portions require over bending is dependant on the material used for the terminals. In the preferred embodiment of the invention, the terminals are made of phosphor bronze material and the terminal lead portions are overbent at an angle θ in the range of 8°–12°.

While the above invention has been made with reference to a plug connector such as 2, the invention could also be incorporated into use with a receptacle type connector such as 102 as shown in FIG. 9. Receptacle 102 is of the type having a forward housing portion 108 which is receivable within the outer shroud 8 of the plug connector 2 (FIG. 1), the housing portion 108 including an opening 120 therein profiled to be received over the terminal receiving platform 20, such that the contact portions 142 and 152 are in mating engagement with the contact portion 42 and 52 of the plug member 2.

While the method herein described, and the article made by this method, constitute preferred embodiments of this invention, it is to be understood that the invention is not limited to this precise method and article, and that changes may be made in either without departing from the scope of the invention, which is defined in the appended claims.

What is claimed is:

1. A surface mount electrical connector for circuit board mounting, the connector comprising:
    an insulative housing having a front terminal mounting section having a plurality of terminal receiving passageways extending therethrough, and mounting feet extending rearwardly of said terminal mounting section proximate to outer side edges of said housing for mounting on the circuit board;
    multiple electrical terminals positioned in said housing in said terminal receiving passageways, said terminals comprising mating contact portions positioned in said front terminal mounting section with said contact portions in at least two horizontal rows, and lead sections positioned intermediate said mounting feet in at least two vertical rows, and surface mount contact portions positioned at ends of said lead sections;
    a tine plate for positioning said surface mount contact portions, said tine plate having projection means extending from a lower surface of said tine plate facing said surface mount contact portions;
    said projection means comprise elongate ribs in like number as said rows of surface mount contact portions, said ribs being positioned above said surface mount contact portions in a facing relation, said ribs include curved surfaces facing said surface mount contact portions,
    said tine plate includes a tab extending from each end thereof, and
    said mounting feet of said housing include vertical grooves therein for receipt of said tabs, the tine plate being slidable relative to said lead sections to position said surface mount contact portions into a predetermined array.

2. The connector of claim 1, wherein the tine plate is slidable along said lead sections with sufficient frictional engagement to position the tine plate in various vertical positions.

3. The connector of claim 1, wherein said housing includes an open upper face above said tine plate for access to said terminal lead sections and said tine plate from above.

4. A surface mount electrical connector for mounting on a substrate, comprising: an insulative housing, multiple electrical terminals in the housing having surface mount contact portions near ends of the terminals for engaging a substrate for mounting the connector, a plate receiving the terminals, projection means of the plate adjacent a recessed area of the plate, the terminals having been bent against the projection means to extend the ends toward the recessed area, and to extend the surface mount contact portions of the terminals along the recessed area and spaced from the plate, and
    a mounting surface of the housing adapted to engage the substrate, and the plate is adjustable in position relative to the mounting surface to locate the projection means relative to the mounting surface, whereby the ends of the terminals extend slightly beyond the mounting surface after the terminals have been bent against the projection means.

5. A surface mount electrical connector as recited in claim 4, wherein, said projection means extend across the terminals, and the terminals are adapted to extend between the projection means and the substrate.

6. A surface mount electrical connector as recited in claim 4, wherein, the plate is adjustably mounted to the housing for adjustment in position relative to the mounting surface.

7. A surface mount electrical connector as recited in claim 4, wherein, the housing includes mounting feet means, the plate is adjustably mounted along the mounting feet means for adjustment in position relative to the mounting surface.

8. A surface mount electrical connector as recited in claim 7, wherein, the mounting feet means are spaced apart, the terminals extend between the spaced apart mounting feet means, and the plate extends between the spaced apart mounting feet means.

9. A surface mount electrical connector as recited in claim 8, wherein, the mounting surface is on the mounting feet means.

10. A surface mount electrical connector as recited in claim 4, and further including: spaced apart mounting feet means of the housing, the plate being between the spaced apart mounting feet means, the terminals extending between the spaced apart mounting feet means, the plate being mounted to the housing, apertures in the plate receiving the terminals and extending the terminals in a direction toward the substrate, and the projection means being adjacent to the apertures.

11. A surface mount electrical connector for mounting on a substrate, comprising: an insulative housing, multiple electrical terminals in the housing having surface mount contact portions near ends of the terminals for engaging a substrate for mounting the connector, a plate receiving the terminals, projection means of the plate adjacent a recessed area of the plate, the terminals having been bent against the projection means to extend the ends toward the recessed area, and to extend the surface mount contact portions of the terminals along the recessed area and spaced from the plate, and
    slots in the housing extending in a direction toward the substrate, the plate being slidable along the slots in said direction, apertures in the plate extending in said direction, the projection means being adjacent the apertures, and the terminals being received through the apertures and having been bent against the projection means.

12. A surface mount electrical connector for mounting on a substrate, comprising: an insulative housing, multiple electrical terminals in the housing having surface mount contact portions near ends of the terminals for engaging a substrate for mounting the connector, a plate receiving the terminals, projection means of the plate adjacent a recessed area of the plate, the terminals having been bent against the projection means to extend the ends toward the recessed area, and to extend the surface mount contact portions of the terminals along the recessed area and spaced from the plate, and apertures extending through the plate, the terminals extending through the apertures, the projection means being adjacent the apertures, and the plate being mounted to the housing slidably in a direction toward the substrate.

13. A method of forming electrical terminals of an electrical connector with surface mount contact portions at ends of the terminals, comprising the steps of:

inserting ends of the terminals through apertures extending through a plate, assembling the plate to the connector for adjustable movement of the plate relative to a mounting surface of the connector, moving the plate while assembled to the connector to a desired position relative to the mounting surface, bending the terminals near the ends thereof against the plate, such that the terminals near the ends thereof against the plate extend slightly beyond the mounting surface of the connector, and thereby ends of the terminals also extend slightly beyond the mounting surface for engaging with a slight force a substrate on which the mounting surface is to be mounted, whereby the ends of the terminals provide surface mount contact portions of the terminals.

14. A method as recited in claim 13, wherein the step of bending the terminals further includes the step of:

bending the terminals near their ends against projection means of the plate positioned near the apertures.

15. A method as recited in claim 14, and further including the step of: bending the terminals to extend the ends of the terminals into a recessed area of the plate adjacent to projection means, and permitting spring back movement of the ends of the bent terminals in a direction outward from the recessed area.

* * * * *